(12) United States Patent
Hofmann

(10) Patent No.: US 8,927,899 B2
(45) Date of Patent: Jan. 6, 2015

(54) METHOD OF MANUFACTURING A CIRCUIT CARRIER AND THE USE OF THE METHOD

(75) Inventor: Hannes P. Hofmann, Schwäbisch Gmünd (DE)

(73) Assignee: Atotech Deutschland GmbH, Berlin (DE)

( * ) Notice: Subject to any disclaimer, the term of this patent is extended or adjusted under 35 U.S.C. 154(b) by 1942 days.

(21) Appl. No.: 10/587,691

(22) PCT Filed: Jan. 20, 2005

(86) PCT No.: PCT/EP2005/000698
§ 371 (c)(1),
(2), (4) Date: Jul. 27, 2006

(87) PCT Pub. No.: WO2005/076681
PCT Pub. Date: Aug. 18, 2005

(65) Prior Publication Data
US 2007/0163887 A1    Jul. 19, 2007

(30) Foreign Application Priority Data
Jan. 29, 2004  (DE) .................... 10 2004 005 300

(51) Int. Cl.
| | |
|---|---|
| *B23K 26/00* | (2014.01) |
| *H05K 3/02* | (2006.01) |
| *H05K 3/46* | (2006.01) |
| *H05K 3/04* | (2006.01) |
| *H05K 3/10* | (2006.01) |
| *H05K 3/18* | (2006.01) |

(52) U.S. Cl.
CPC ............ *H05K 3/465* (2013.01); *H05K 3/045* (2013.01); *H05K 3/107* (2013.01); *H05K 3/188* (2013.01); *H05K 3/4661* (2013.01); *H05K 2201/0323* (2013.01); *H05K 2201/0329* (2013.01); *H05K 2201/09036* (2013.01)
USPC ........................................ 219/121.69; 29/846

(58) Field of Classification Search
CPC ....... H05K 3/645; H05K 3/045; H05K 3/107; H05K 3/188; H05K 3/4661; H05K 3/1258; H05K 3/246; H05K 3/125; H05K 3/4069; H05K 3/4664; H05K 2201/09036; H05K 2201/0323; H05K 2201/0329; H05K 2201/0347; H01L 21/486; H01L 21/4867; H01L 2924/0002; H01L 2924/09701
USPC ........ 219/121.69; 205/80; 428/209, 596, 607, 428/626; 29/830, 831, 832, 852, 846; 257/40

See application file for complete search history.

(56) References Cited

U.S. PATENT DOCUMENTS

| | | | |
|---|---|---|---|
| 4,651,417 A | 3/1987 | Schumacher, III et al. ..... | 29/848 |
| 5,382,315 A | 1/1995 | Kumar .......................... | 156/643 |

(Continued)

FOREIGN PATENT DOCUMENTS

| | | |
|---|---|---|
| DE | 196 25 386 | 6/1996 |
| DE | 196 20 095 A1 | 11/1997 |

(Continued)

OTHER PUBLICATIONS

German Office Action, Application No. 10 2004 005 300.6-34, dated Nov. 14, 2007.

(Continued)

*Primary Examiner* — Henry Yuen
*Assistant Examiner* — Hung D Nguyen
(74) *Attorney, Agent, or Firm* — Renner, Otto, Boisselle & Sklar, LLP

(57) ABSTRACT

A method of manufacturing a circuit carrier and the use of said method are proposed, said method comprising, after providing a printed circuit board (a), coating the circuit board on at least one side thereof with a dielectric (b), structuring the dielectric for producing trenches and vias therein using laser ablation (c) are performed. Next, a primer layer is deposited onto the dielectric, either onto the entire surface thereof or into the produced trenches and vias only (d). A metal layer is deposited onto the primer layer, with the trenches and vias being completely filled with metal for forming conductor structures therein (e). Finally, the excess metal and the primer layer are removed until the dielectric is exposed if the primer layer was deposited onto the entire surface thereof, with the conductor structures remaining intact (f).

24 Claims, 8 Drawing Sheets

(56) References Cited

U.S. PATENT DOCUMENTS

| | | | |
|---|---|---|---|
| 5,577,309 A * | 11/1996 | Frank et al. ............... 29/25.42 |
| 5,666,722 A | 9/1997 | Tamm et al. | |
| 5,759,427 A | 6/1998 | Cibulsky et al. ............... 216/91 |
| 5,774,340 A * | 6/1998 | Chang et al. ............... 361/771 |
| 5,968,333 A | 10/1999 | Nogami et al. ............... 205/184 |
| 6,035,527 A | 3/2000 | Tamm | |
| 6,240,636 B1 * | 6/2001 | Asai et al. ............... 29/852 |
| 6,740,416 B1 * | 5/2004 | Yokogawa et al. ............... 428/446 |
| 6,930,256 B1 | 8/2005 | Huemoeller et al. | |
| 6,930,257 B1 | 8/2005 | Hiner et al. | |
| 6,967,124 B1 | 11/2005 | Huemoeller et al. | |
| 6,987,661 B1 | 1/2006 | Huemoeller et al. | |
| 7,028,400 B1 | 4/2006 | Hiner et al. | |
| 7,185,426 B1 | 3/2007 | Hiner et al. | |
| 7,297,562 B1 | 11/2007 | Huemoeller et al. | |
| 7,312,103 B1 | 12/2007 | Huemoeller et al. | |
| 7,334,326 B1 | 2/2008 | Huemoeller et al. | |
| 7,399,661 B2 | 7/2008 | Hiner et al. | |
| 2001/0013472 A1 | 8/2001 | Nakamura et al. ............... 205/103 |
| 2002/0129972 A1 | 9/2002 | Konrad et al. ............... 174/257 |
| 2002/0175402 A1 * | 11/2002 | McCormack et al. ............... 257/700 |
| 2002/0177006 A1 * | 11/2002 | Clothier et al. ............... 428/596 |
| 2004/0086806 A1 * | 5/2004 | Tsushima ............... 430/315 |
| 2008/0020132 A1 | 1/2008 | Huemoeller et al. | |
| 2008/0043447 A1 | 2/2008 | Huemoeller et al. | |

FOREIGN PATENT DOCUMENTS

| | | |
|---|---|---|
| DE | 199 10 482 A1 | 5/2000 |
| EP | 0 677 985 A1 | 10/1995 |
| EP | 0 817 549 A2 | 1/1998 |
| EP | 1 376 234 A1 | 1/2004 |
| EP | 1 377 146 A2 | 1/2004 |
| JP | 61224391 | 3/1985 |
| JP | 1-273687 | 11/1989 |
| JP | 6-87087 | 3/1994 |
| JP | 7283510 | 10/1995 |
| JP | 10-126055 | 5/1998 |
| JP | 10224015 | 8/1998 |
| JP | 11266084 | 9/1999 |
| JP | 2000013022 | 1/2000 |
| JP | 2000202668 | 7/2000 |
| JP | 2000261141 | 9/2000 |
| JP | 2001516961 | 10/2001 |
| JP | 2002185137 | 6/2002 |
| JP | 200348088 | 2/2003 |
| JP | 2003204140 | 7/2003 |
| KR | 20030080546 | 10/2003 |

OTHER PUBLICATIONS

Kondo et al.; "Abrasive-Free Polishing for Copper Damascene Interconnection"; *Journal of the Electrochemical Society*; 147 (10) 3907-3913 (2000).

Official Action for Japanese Patent Application No. 2006-550071, dated Feb. 5, 2010.

Official Action for Chinese Patent Application No. 200580003442.0, dated Mar. 12, 2010.

Official Action for Korean Patent Application No. 10-2006-7013429, dated Mar. 2, 2011.

Official Action for Japanese Patent Application No. 2012-252028 dated Nov. 19, 2013 and its English translation.

Official Action for Japanese Patent Application No. 2006-550071 dated Jan. 15, 2013 and its English translation.

Official Action for Japanese Patent Application No. 2006-550071, dated Jun. 12, 2012.

Official Action for Japanese Patent Application No. 2006-550071, dated Jul. 5, 2011.

* cited by examiner

Via² - Process
Multi pass skiving – before laser polish - 0.8 mm BGA

Trench Profile

Multiple pass skyving polished

Several different laser routines are possible.

SEM – Detail of hole trench intersection

METHOD OF MANUFACTURING A CIRCUIT CARRIER AND THE USE OF THE METHOD

The present invention relates to a method of manufacturing circuit carriers and the use of the method.

Such type manufacturing methods are known from prior art, the following method steps being generally performed: i) providing a substrate, said substrate consisting of at least one dielectric layer and of copper layers on at least one side thereof, ii) structuring the surface of the substrate according to a conductor pattern to be formed, iii) depositing a conductive material in regions corresponding to the conductor pattern for forming conductor structures, and iv) removing the conductive material outside of the conductor pattern. Alternatively, the conductor pattern may be formed by selectively etching away exposed base copper after structuring the surface of the substrate in step ii).

For structuring the surface, method steps such as photolithography or laser ablation may for example be used. Structuring the surface of the substrate using photolithography is thereby increasingly substituted by laser direct imaging as a result of the further development of the laser technique and of the substrate materials since there are limits to the process of photolithography in producing very fine conductor patterns.

More specifically current methods are mainly the tenting technique (a negative photoresist is used to pattern the outer sides of the board material while tenting the through holes therein and subsequent etching of the outer copper clad), the pattern-and-etch technique (a negative photoresist is used to pattern the outer sides of the board material, a metallic etch resist is formed in the pattern and the photoresist is finally removed for subsequent etching of the outer copper clad) and the semi-additive technique (with differential etch). The only difference for achieving HDI conductor structures (HDI=High Density Interconnect; conductor structures comprising circuit traces having a line width of at most 100 µm and a spacing between the traces of at most 100 µm) is caused by the applied surface thickness of the initial copper layer on the surface of the board. HDI conductor structures used in the industry so far are to a degree of greater than 95% made by discrete circuits located on the surface of the board. The structures in different circuit planes are either electrically connected by mechanically drilled through holes or by laser drilled micro vias.

In either case of the above techniques, lamination of either copper clad (e.g., resin coated copper (RCC) or bare laminate outer layers onto core boards (here innerlayers or core) is required. The production sequence to generate such HDI boards consists of 17-20 production steps and also provides a broad platform of possible errors. The limitation to HDI boards results from misregistration between the individual conductor structures in different conductor planes, because of the small dimensions of the conductor structures.

The drawbacks of the conventionally manufactured HDI boards are due to a plurality of reasons: Line and space creation of conductor structures depends mainly on the etch depth given prior to a subtractive etch process and on the thickness of the photoresist employed. Etch thickness of outer layer circuits and associated line resolution are as follows: Using the tenting technique a possible resolution with a 75 µm conductor line width and a spacing between adjacent conductor traces of down to 100 µm may be achieved, if a negative etch (photo)resist having a thickness of 38-50 µm and a copper clad having a thickness of 5-17 µm are used and if copper is additionally plated to a thickness of 25 µm. Thinner etch resists allow a better etch resolution, but are otherwise limited in their tenting capability. Using the pattern-and-etch technique alternatively a possible resolution with a 50 µm line width and a 75 µm spacing may be achieved, if a negative etch (photo)resist having a thickness of 38 µm and a copper clad having a thickness of 5-25 µm (plus 5-10 µm flash copper plating) are used, further if copper is additionally pattern-plated to a thickness of 25 µm and if an etch (metal)resist (Sn, Sn/Pb or Ni/Au) having a thickness of 5-10 µm is used. The total etch depth can vary from 10 µm to up to greater than 25 µm, depending on the type of the process route followed. By finally using the semi-additive technique a possible resolution with a 25 µm line width and a 35 µm spacing with an etch factor amounting to 1.2 may be achieved, if a bare board laminate is first covered with a 0.6-0.9 µm thick electroless copper layer and a negative etch (photo)resist having a thickness of 38 µm (which allows to plate copper in a pattern having a thickness of at least 25 µm) is used. In this case the common flash copper layer may be removed using a differential etch process. However, residual palladium underneath the copper layer, which originates from the catalyst layer for electroless copper, needs to be stripped in this case e.g. in a suitable strong acid or strong alkaline solution.

The above three listed techniques to produce HDI circuits are the source of a variety of failure mechanisms, which have to be taken into account and which are responsible for the maximum of achievable targets:

First there is a tolerance both in x- and in y-direction (warp and weft) in pressing the laminates to produce the board material: During the generation of multilayer circuits the demand on planarity is the main concern for further success and yield of the finished board (prior to structuring the outer layers). Therefore industry has developed lamination methods to induce the least amount of stress to the boards and to remove inner tension in warp and weft direction (bow and twist). Since the elongation modulus of printed circuit laminates are different in all three dimensions (x,y,z) the deviation achieved could be defined to be within ±250 µm (measured by DOE using in all cases the same laminate and exactly the same pressing parameters).

In the second place there are tooling and registration tolerances: All mechanical and photolithographic production steps require registration to a reference point (or to several reference points). Often such reference points are provided by hard metal pins (hole-to-pin) or by optical targets. Temperature changes and the operator precision allow a maximum registration capability of ±25 µm across the surface area of production panels (which have a size of as large as 18"×12" (45 cm×30 cm) or even 18"×24" (45 cm×60 cm)). In most of the cases failures from inner to outer layers can be found in a sectorial mismatch. Photolithographic operations do not provide a 100% solution to compensate for these errors, though CNC drilling machines can be adapted to these sectorial deviations and implement these deviations upon awareness by the personnel. This phenomenon leads to a near failure result in printed circuit board manufacturing processes.

Third there are image transfer tolerances arising: The registration risk, plus the sectorial deviations as well as the fact, that thick film resists having a thickness of 37 µm bare the risk of over or underexposure by stray light, generate a multiplication of errors. Industry's answer to this is to generate target pads, for example packaging pads, and holes, the ratio of the pad diameter to the hole diameter being approx. 3:1. This results in annular rings being formed around the holes to balance any misfit of the location of the hole to the location of the pad.

In the fourth place there are developing, metal resist and etching tolerances: Chemical development of photoresists always imposes the risk of the stray light effect during imaging or of other sources of error. For example semi-cured or over-cured resists may be developed away or resist developing may not be sufficient such that the resist remains at the foot (flank) of a resist side wall. An estimate has to be done prior to applying a resist in terms of how much more must be given to reach the desired dimension. This affords expert skills. The same problem arises when alkaline or acidic etching is used to generate the circuits. In this case a so-called over-etch factor has to be taken into account to reach the final (target) dimensions (±10-40% of the total conductor dimension tolerance as undercut). Pattern-plated outer layers are firstly subject to a ±20-60% deviation in copper layer thickness. This reflects the deviation in etch depth resulting in etch undercut. In addition over-growing metal on the resist makes it almost impossible to physically clear spaces between conductor structures which have a line width and spacing of smaller than 50 µm each.

In the fifth place there are drilling tolerances: Mechanical and laser drilling generally suffers from tolerances originating from misregistration, (rotational) deflection of the drill bit and machining, the latter mainly being due to repetition, tooling and depth accuracy.

Using conventional techniques with all the tolerances discussed herein above and even employing the highest standard with the above techniques allows only to have 1-2 circuit traces with a line width of 50-100 µm to pass between two package pads comprising holes, the pitch of the pads being 0.8-1 mm. Designing the pattern to have two circuit traces pass between two pads requires fine line structuring and solder resist ablation by laser. The line width of the circuits is in the range of 50 µm in this case. These circuit traces rest on the top of the dielectric surface of the outerlayer or the innerlayer, the traces adhering well to the board substrate underneath with the aid of the so-called treatment of the copper clad, the treatment having a roughness of 3-6 µm. The best reproducible tolerance for the line width and spacing being in the range of ±10 µm is caused by the precision of the used image transfer device.

Ending up with circuit traces that have a line width of 50 µm and spacings between them of 50 µm the pads to be used will still have to have a diameter of greater than 120 µm. The annular ring of these pads has a width of approx. 50 µm. The integrity of the circuit is limited by the treatment roughness between the circuit trace and the board substrate, which cannot be abandoned because of the surface adhesion necessary for manufacturing and assembly. Such construction, however, imposes further problems in that impedance control and high frequency applications are limited due to this roughness.

Using the above techniques does not present a solution to manufacture circuit boards which are appropriate to directly mount and electrically connect semiconductor chips or semiconductor chip packages having a very fine pitch of connecting terminals, such as BGA, CSP and especially FC-type packages. These electric components have an external connector pitch lying in the range of from 0.20 mm (FC type) to 0.50 mm (CSP type). In order to mount and electrically connect these components on printed circuit boards, a new method has to be found out, which offers finer conductor structures at a much lower manufacturing tolerance. As the printed circuit boards being mounted with these new electric components must also meet better re-distribution requirements at the same level, it is desired to have as much as possible surface through pass connectivity.

DE 196 20 095 A1 discloses a method of manufacturing printed circuit boards by which trenches and through holes are first formed in a dielectric attached for example to a carrier frame, preferably by laser ablation using an excimer laser. Then, the dielectric is provided with a ground layer that is next selectively removed again except from the sites of the trenches and through holes. The remaining ground layer is now metal-plated for forming conductor structures such as circuit traces and through-plated holes, either directly or after light activation. Another possibility described therein is to dispense with selective treatment of the ground layer and to directly deposit metal on the entire surface thereof; the through holes may thereby also be completely filled with metal. In this case, the metal is next etched back as far as the dielectric with the filled trenches and through holes being formed flush with the dielectric.

EP 0 677 985 A1 discloses another method of manufacturing printed circuit boards. This document turns away from multiple layers of substrates and the like prior art processes requiring multilayer laminated materials, which are assessed to be expensive and often not available in constant quality. At first, various recesses are produced in a carrier substrate by means of laser ablation, preferably using an excimer laser, like also shown in DE 196 20 095 A1. Next, through holes are formed, using further laser ablation. A conductive material is thereafter deposited substantially on the entire surface of the substrate, said conductive material being next reinforced preferably by plating, with the material being also deposited onto the walls of the through holes. In a last step, the deposited conductive material is removed by mechanical polishing except for in the recesses and through holes. Selective deposition of conductive material in the recesses and through holes only can be effected by selectively activating the carrier substrate in the trenches and through holes by means of laser irradiation, a substance that becomes electrically conductive when laser irradiated being deposited onto the walls of the recesses and through holes.

Today's requirements for the production of technical apparatus such as for example computers, mobile phones or digital cameras are characterized inter alia by demands placed on an increasing miniaturization of circuit carriers as mentioned herein above. For this purpose, circuit carriers with conductor structures having ever smaller dimensions and an ever increasing wiring density as well as increasingly smaller components are needed for use in manufacturing what are termed High-Density Printed Circuit Boards.

The methods mentioned herein above permit to form trenches and via holes in a dielectric according to a circuit pattern using high-resolution laser technique. However, formation of an increased circuit density encounters limits wherever through-plated holes are to be produced through a larger number of conductor planes. For, in order to achieve a very high circuit density, certain conditions must be met such as for example an aspect ratio of diameter/depth of the through holes optimally suited for metal plating and through holes occupying little space.

An even more severe drawback of all the methods as shown herein above is that the HDI circuit boards being manufactured using these methods suffer from being extremely expensive because of the problems encountered in producing such boards (number of processing steps and unavoidable tolerances to produce the circuit traces with the required HDI resolution; therefore increased scrap). In order to achieve the required integration density, e.g., comprising manufacturing boards having eight to twelve innerlayers and in addition two outer signal layers which also serve to electrically connect electric components, a vast plurality of process steps is required to manufacture such boards. For producing multilayers having a usual board size of for example 45 cm×60 cm by using conventional techniques is virtually impossible, if HDI circuit traces are to be produced.

Even if the methods described in DE 196 20 095 A1 and EP 0 677 985 A1 would be used to manufacture circuit boards having the required integration density while offering the possibility to electrically connect electric components as outlined herein above, the circuit boards manufactured in accordance with one of these methods would be extremely expensive because the yield to manufacture these boards will drastically decrease. This is due to the fact, that reject boards would be produced which would not fit to the specifications or which would not exhibit all designed conductor connections as required. Upon thorough examination of such boards it has turned out that the yield decreases drastically when very fine circuit traces are produced and complex multilayers are manufactured. Due to the sequential build-up of the individual signal layers in the boards manufactured according to any of the methods disclosed in DE 196 20 095 A1 and EP 0 677 985 A1, the failure rates on each individual layer sum up so that the reject rate will increase dramatically even after having only finished a relatively small number of signal layers. Since such failure can only be detected after having finished the board, a considerable loss of boards will inevitably be the consequence.

It is therefore the object of the present invention to provide a method for manufacturing circuit carriers that permits further miniaturization i.e., formation of smaller-dimensioned conductor structures and a higher wiring density. Extremely fine conductor structures are intended to be thus formed, said structures exhibiting a good bonding strength to the substrate and advantageous heat dissipation properties as well as sustaining high mechanical and thermal loads. Moreover, the method shall be cost-effective and easily manageable. This will of course also comprise fulfilling the object that the manufacture of such carriers will be possible at a high yield even if HDI conductor structures are to be produced and with the integration density required for a main board of a computer for example.

These objects are solved by the method as set forth in claim 1 and by the use of the method as set forth in claim 17. Preferred embodiments of the invention are described in the sub-claims.

The method serves to manufacture circuit carriers such as printed circuit boards, chip carriers and multichip modules. It involves the following method steps:
  a) Providing a printed circuit board;
  b) Coating the circuit board on at least one side thereof with a dielectric;
  c) Structuring the dielectric for producing trenches and vias (recesses) therein using laser ablation;
  d) Depositing a primer layer onto the entire surface of the dielectric or depositing the primer layer onto the walls of the produced trenches and vias only;
  e) Depositing a metal layer onto the primer layer (additive process), with the trenches and vias being completely filled with metal for forming conductor structures therein; and
  f) Removing the metal layer and the primer layer, except for in the trenches and vias, to expose the dielectric if the primer layer has been deposited onto the entire surface in method step d).

The method of the invention is designed to produce very High Density Printed Circuit Boards, utilizing an electroplating technology to metallize three-dimensional structures created in dielectric material of any kind.

The printed circuit board to be provided in method step a) is a conventionally manufactured printed circuit board. Such boards are manufactured by laminating individual circuit laminates together to form a double sided or multilayer board. The circuit traces on the outer sides or on innerlayer laminates of this board are formed using any of the tenting, pattern-and-etch, semi-additive or other conventional techniques described herein above. The traces formed in this manner are provided on top of the board material, overlying same. Thereupon they may rest with a sufficient adhesion with the aid of material roughness.

The vias serve to connect different conductor planes in the circuit carrier and therefore generally extend completely through at least one dielectric layer. The trenches serve to interconnect for example vias to one another, recesses for packaging pads for electric components to one another or vias and such recesses for packaging pads together. The trenches therefore do not extend completely through the dielectric layer.

The printed circuit board being a base layer can inter alia be utilized for supplying current during electrochemical metal plating when the circuit traces and the via structures to be metal plated are conductively connected to the base layer. For this purpose, electric contact pads for supplying current that are connected to the base layer are provided outside of the area of the circuit carrier that is to be structured.

The structure of the trenches corresponds to the conductor structure pattern that is to be formed therein. The conductor structure pattern may for example comprise both circuit traces and packaging pads for electric components and metal areas, for example for shielding or for forming capacitors. Herein after, the conductor structure patterns to be formed in the trenches will be generally referred to as circuit traces.

By starting with a conventional printed circuit board as a base layer to form thereon additional signal layers having the extremely fine conductor structures with the method of the invention, it will be possible to at the same time manufacture such circuit carriers with the integration density which is required for a computer system board for example and to manufacture such boards at a high yield even if ultra-HDI conductor structures are to be produced e.g., with lines and spaces being below 50 µm each, in order to allow mounting and electrical connection of complex semiconductor chip packages. Thus first a conventional printed circuit board e.g., a multilayer, is manufactured using well-established manufacturing techniques. Such circuit board being provided with innerlayer circuits, if required, can be examined as to the absence of defects prior to forming the HDI signal layers on the outer sides thereof. This circuit board will then be further processed according to the invention by applying the dielectric, structuring the dielectric and forming the conductor structures in the recesses formed in the dielectric. It is not required that the conventional circuit board is provided with conductor structures of the HDI-type. The HDI-type conductor structures will rather be formed on the outer sides of the circuit carrier by performing the method steps b) through f) of the invention. In fact it will be advantageous to provide the conventional circuit board with relatively wide conductor structures in order to allow competitive manufacture thereof at a constant and high quality.

Thus the use of a conventionally manufactured printed circuit board as a base layer allows meliorating the cost-effective non-HDI printed circuit board to become a high-technology circuit carrier being provided with finest conductor structures on the outer sides thereof, this metamorphosis being performed by a very easy and cost-effective method while maintaining a high production yield.

The method of the invention permits to produce these extremely fine conductor structures, such as circuit traces and filled vias, in one method step and to build up, in a simple manner, complex circuit carriers having many conductor structure planes which comprise conductor structures of small dimensions and an ever increasing wiring density. It is thus possible to directly establish an electrical contact between semiconductor components and the packaging pads formed on the circuit carrier even if the contacting grid pattern of the corresponding contact bumps on the components is very small. Such type components are increasingly utilized in the technique since the very components are required to feature a very high integration density. It is thus possible to directly contact semiconductor components or semiconductor chip packages with a ball-grid-array (BGA) or fine-grid-array-package matrix or further GA, CSP or FC-type packages for example.

As contrasted with prior art methods by which the trenches for the circuit traces and the vias are to be manufactured in two separate steps, which requires additional positioning and ablation steps, all of the structures can preferably be made in only one single method step (process operation) using the method of the invention, meaning that the trenches and vias are formed in the dielectric in a continuous operation without any demounting and remounting of the circuit carrier in the manufacturing plants being required, such that additional registration steps between the individual operations to be performed for forming the trenches and vias are unnecessary. This again improves yield and hence cost because misregistration problems associated with such demounting and remounting do not occur.

The dielectric is preferably deposited onto the circuit board in such a manner that the roughness at the phase boundary between the dielectric and the circuit board is very small. The same applies to forming further circuit planes by depositing another layer of dielectric onto already formed circuit traces and filled vias. This contrasts with conventional circuit carriers that are made from a copper clad material. This permits to prevent uncontrolled impedance fluctuations and more specifically undesired capacitances from forming in the circuits so that it is readily possible to manufacture impedance-controlled circuits using the method of the invention.

By filling the vias and embedding the circuit traces in the dielectric layer, a particularly tight bond of the metal layer to the dielectric is achieved. It has been found out that copper deposited in the trenches and vias adheres well to the walls thereof. As a result, the circuit carrier formed is highly stable to thermal and mechanical loads. This is achieved i.a. by the fact that the circuit traces, which are embedded here, are subject to smaller shear forces than circuit traces provided on top of outer layers of conventional printed circuit boards. As the trenches and vias are completely filled, the circuit carrier also features very good heat dissipation properties through the creation of a solid metal plated connection, preferably copper plated connection, from one layer in the assembly to the next, while simultaneously forming the associated conductor tracks. Moreover, usual defects at interconnects such as dog bone pads or fan outs as well as residual rings could not be observed. It is moreover possible to produce impedance-controlled conductor structures.

The exclusive use of an additive process for depositing the metal in the trenches and vias in the dielectric dispenses with the etching steps for forming the conductor structures. This is another reason for achieving a much improved definition of the conductor structures and, as a result thereof, a finer structure thereof.

The trenches and vias are completely filled with metal for forming conductor structures therein. This leads to a reduced defect rate in the manufacture of circuit carriers: By completely filling the recesses a more secure bonding of the metal of the circuit traces to the metal in the vias is made possible than if the vias and trenches would not be completely filled with metal, but rather cover the walls thereof. By complete filling the recesses a large contact area is generated between the two metal areas to be connected. This ensures better resistance to thermal stress, like during soldering or chip bonding. The same effect is achieved if the trenches and vias are connected to each other.

The method of the invention is cost-effective and readily manageable. In manufacturing multilayered printed circuit boards using conventional methods, positioning errors during optical recognition, orientation and layer accommodation (misregistration) are caused to compound with every single layer. If a great number of layers are provided, the increasing sum of these differences requires compensating corrections. Fine circuit traces with small spaces there between on a multilayered construction therefore face a technological challenge. As a result, the cost for processing increases with the number of layers and the circuit density. The method of the invention permits to reduce these disadvantages, thus reducing the reject rate and the cost of production. For, by using the method of the invention, two-layered structures that are formed on either side of the dielectric layer by performing once the method steps a) through f) mentioned herein above can be produced advantageously in one step by unique positioning through copper filling by electroplating. Two positioning steps and two electroplating steps are thus reduced to one step each.

Successful manufacturing of finest conductor structures is more particularly possible because vias are used for contacting different planes of conductor structures. This offers a number of fundamental advantages over the use of through holes.

As is well known, through holes must be designed from the beginning to have a larger diameter (at least 150 μm) depending on the depth since with increasing depth it becomes technically ever more difficult to form a through-plated metal layer using wet-chemical metal plating methods. Additionally, through holes usually comprise at their upper and lower rim annular rings onto which resist material, which is needed for structuring the conductive pattern, comes to rest. The diameter of the holes, which is large anyway, is thus further increased so that accordingly sized areas on the printed circuit board or in the various planes cannot be used for forming conductor structures. The method of the invention therefore allows connecting the trenches and the vias to each other in a landless design. This ensures a significant increase in conductor packaging density as well as broadening the overall process-operating window considerably.

After a first plane of conductor structures has been made in the dielectric by forming conductor structures such as circuit traces and filled vias, further method steps can be performed, another dielectric being deposited onto the dielectric of the circuit carrier comprising the conductor structures being formed. Said dielectric is then preferably treated according to the method steps b) through f) in order to produce another plane of conductor structures. For this to be performed the method of the invention may preferably comprise the following further method steps which are performed once or several times after method step f):

g) Depositing another dielectric onto the dielectric being provided with trenches and vias; and h) Repeating the steps c) through f).

The other dielectric may thereby be made of the same or of another material. The method steps described can be repeated depending on the structure desired for the circuit carrier. Finally, a terminating layer can be deposited onto the outer planes of conductor structures, for example in order to protect the bare copper surfaces of the circuit traces from corrosion or during soldering. A current secondary resist or a permanent resist, more specifically a solder resist, may be utilized for this purpose, said resist being for example structured by photolithography.

The produced circuit traces and filled vias preferably have the following dimensions: width of the circuit traces: <10-80 µm; height of the circuit traces: <10-50 µm; diameter of the vias: <10-80 µm, length of the vias: 50-130 µm, with the maximum height corresponding to the thickness of the dielectric. The dielectric typically has a thickness of 50-130 µm.

Producing trenches and vias in the dielectric thereby also comprises the production of combined trenches and vias, meaning that trenches having vias formed therein are produced. Conductor structures are formed thereafter as a result thereof, said structures comprising circuit traces with filled vias. If the vias correspond to the thickness of the dielectric, they can contact circuit traces in different planes of conductor structures.

After the first plane of conductor structures is made, the printed circuit board, which fixes the dielectric, preferably remains on the dielectric during the formation of further planes of conductor structures.

The printed circuit board also serves as a carrier member for the signal layers being formed in method steps b) through f). It may for example be a multilayer or a semiconductor chip. The circuit board preferably has a sandwich structure.

FR4 and FR5 material, High-Tg FR4 materials, BT resins, cyanate ester resins, APPE, EPPO, RCF, LCP (liquid crystal polymers), PTFE, polyimide can be preferably used as the dielectric. FR4 materials are particularly preferred because they are cheaper and may be processed more easily in a more reproducible manner than the majority of the other materials.

The afore mentioned materials are more specifically filled with filler materials providing dimensional stability such as laser glass (Isola, Dielektra) or Thermount (DuPont). These materials advantageously provide the multilayered structure with dimensional stability. In the case of glass inserts it has been found out that uniform ablation is possible by using flat-woven glass (Isola, Dielektra) with an absorbing coating.

For example the following material combinations consisting of material clad on one side with copper and prepregs (not fully cured (stage B) glass fiber mat reinforced FR4-resin layers) may be utilized to manufacture the carrier materials:

TABLE 1

Examples of material combinations

| Laminate with one side clad with copper | Prepreg |
| --- | --- |
| A1. Laserpreg, Tg 170° C. | B1. Laserpreg, Tg 170° C. |
| A2. IS620, Tg 200° C. | B2. IS620, Tg 200° C. |
| A3. N4000-13, Tg > 210° C. | B3. N4000-13, Tg > 210° C. |
| A4. N4000-6 LD, Tg 175° C. | B4. N4000-6 LD, Tg 175° C. |
| A5. N5000 BT, Tg 185° C. | B5. N5000 BT, Tg 185° C. |
| A6. AKAFLEX KCL PI | B6. AKAFLEX KCL PI |

If such type carrier elements are used, they may serve as a basis for vias. The metal layer for forming the vias may thereby be used as the stop point i.e., as the landing zone during laser ablation. The printed circuit boards or semiconductor chips may be contacted through the filled vias. In the case of the printed circuit boards, the vias are made in the dielectric at those locations on the printed circuit board where metal areas are provided which are electrically contacted through the vias. Further the method of the invention permits to form, concurrently with the upper circuit plane, a second circuit plane on the bottom side of the carrier material.

The method of the invention also permits to manufacture multilayered circuit carriers by assembling individual carriers that have been treated in accordance with the invention, said circuit carriers being optionally continuously connected to one another by solid metal. For this purpose, a printed circuit board that is provided on both sides with dielectric is utilized so that circuit planes may be formed on both sides of the circuit board in the manner of the invention. Thanks to the solid copper connections between the layers, the circuit carrier is particularly resistant to deformation and to shock, insensitive to changes in temperature and features advantageous heat dissipation properties.

The dielectric is structured by laser ablation. The trenches and vias produced by ablation are preferably configured in an approximate V-shape, like notches. This facilitates the electrolytic deposition of metal in the trenches and vias since the depth of the notches is small with respect to the width of their opening.

For laser ablation, unfocused or focused laser light may be directed onto the dielectric. In the first case (projection process), a metal mask is additionally used in order to produce the ablation structures. In this case, the unfocused laser beam is conducted through the metal mask comprising finest openings arranged in the pattern to be produced. In the second case (direct focusing process), this method being the preferred alternative, the laser beam in-focus is guided over the surface of the dielectric so that the embedded structures and vias are formed by the "writing" laser beam (direct-write technique). This direct-write technique comprises scanning a laser beam across the dielectric at those surface regions of the dielectric in which the trenches and vias are to be produced. For this purpose the laser may be deflected using high-velocity mirrors and adjusting the laser to irradiate it at different angles onto the surface of the dielectric. Further the energy of the laser is controlled during ablation. This allows the production with the desired planarity and precision. In-situ registration abandons all other traditionally required registrations and all the photolithographic processes as well as circuit definition etch with the known draw backs like under-cut etc.

For structuring the dielectric, lasers having laser wavelengths more specifically in the UV or in the blue visible range are utilized. Well suited lasers have laser wavelengths of 193, 248, 308 and 355 nm. Suited lasers are Ar ion lasers or excimer lasers. FR4 material may be advantageously processed by the projection method using an excimer laser with a wavelength of 308 nm.

Considerable enhancement of ablation speed can be achieved by exposure of the dielectric to a reactant gas, for example an oxidizing gas, more specifically oxygen or a nitrogen oxide, or fluorine or to any other gas which reacts with the dielectric to form volatile reactants. For this purpose the gas is brought into contact with the dielectric surface simultaneously with irradiating the dielectric surface with the laser light. The gas may for example be blown over the dielectric surface during the exposure.

The dielectric material is preferably removed with a pulsed laser. The advantage thereof is that the quantity of ablated dielectric material can be adjusted in a reproducible manner since every single laser pulse includes a defined amount of energy. In order to achieve a predetermined ablation depth, the laser beam is irradiated at a determined irradiation site with a previously calculated number of laser pulses. This makes the formation of the trenches and vias in one single process operation possible, because the pulsed laser beam can be scanned across the dielectric, while adjusting the energy amount of the laser beam irradiated to the surface area of the dielectric to depend on the depth of the trenches and vias to be produced thereby setting the number of laser pulses being irradiated to said surface area. Therefore, if a trench is to be formed at a certain surface area less laser pulses are required to form same than if a via is to be produced, because the latter has a greater depth. The same principle may be employed if a continuous beam laser is used: In this latter case the power of the laser beam is adjusted to depend on the depth of the trenches and vias to be produced.

By selectively irradiating a determined amount of laser energy in every single pulse, the material may be removed gently. During ablation of the material, the amount of energy may for example be progressively lowered from an initially high value so that the material that is not removed from the walls of the vias and trenches is largely prevented from being damaged. As a result thereof, a defined depth of the via may not only be achieved when the via ends in a metal base layer but also when the via ends "blind" in the dielectric. This also makes the generation of smooth recess walls possible. For this purpose the laser tool may also be used to prepare the surface of the dielectric prior to further treating it for metallization (laser polishing). The latter especially ensures high-frequency conductors with very narrow track tolerances and high resolution.

Laser ablation may for example be performed in a cross-pattern mode of operation. For this purpose, a first bundle of trenches is formed on the substrate either by projection or by the laser direct focusing process, said trenches being preferably oriented to be parallel to each other. Next, a second bundle of trenches is formed, these trenches being also preferably oriented to be parallel to each other and intersecting the trenches of the first bundle at an angle of for example 90°. The trenches of the first bundle may for example be formed by projection in the dielectric lying for example in one plane in a first laser step using a bar mask. By subsequent rotation of the dielectric or of the bar mask with respect to the radiation device, the trenches of the second bundle are produced in a further laser step. At the intersection of the trenches, vias are concurrently formed since, as a result of repeated laser ablation, more material is removed from these areas than from the trenches outside of the points of intersection. Depending on the irradiated energy of the laser and on the material of the dielectric, the vias may have a thickness that corresponds to the thickness of the dielectric.

If the method described herein above is carried into effect by the laser direct focusing process, any circuit structure having vias may be manufactured: for this purpose, the laser is guided over the paralleled trace areas on the dielectric in which trenches are to be formed. As contrasted with the principle described herein above, the laser beam is only directed onto the dielectric if a trace segment is to be formed at this respective location, with the beam being turned off if no segment is desired there. Of course, other scanning modes are likewise possible, such as guiding the laser beam in-focus along a projected path which marks the recesses to be ablated. If different depths are to be generated in the recesses the laser beam is scanned along this path at different velocities: if a via is to be generated the laser is scanned at a lower speed than if a trench is to be generated. Such procedure is necessary if the power of a continuous laser or pulse sequence of a pulsed laser is set constant. If the power or pulse sequence may be varied with time, the scanning speed can be set constant and the energy of the laser beam be adjusted accordingly as to the depths of the recesses to be formed.

After structuring, the primer layer is deposited onto the walls of the trenches and vias. In order to improve the bonding strength of the metal layer to the walls, the latter may also be pre-treated before the primer layer is applied. A plasma desmear process followed by a chemical cleaning process may be utilized for this purpose. Wet-chemical polymer etching processes may also be used in lieu of the plasma desmear process, for example an etching process with alkaline permanganate solution followed by a reduction step for removing resulting manganese dioxide. Current cleaning agents are used for cleaning. The walls may additionally be conditioned to ensure improved formation of the primer layer.

The primer layer is formed according to known methods by performing a treatment with metal activators, more specifically with noble metal activators, for example palladium activators, more specifically $PdCl_2/HCl$— or $PdX_2$/organic protective colloid activators (Neopact®, Atotech; X=palladium ligand) or with monomer solutions for forming conductive polymer layers, for example solutions of pyrrol or thiophene or of derivatives thereof (Seleo®, Atotech) or with carbon suspensions (Shadow®, Electrochemicals), or by sputtering. Neopact® is particularly suited for metal plating PTFE and polyimide. This process comprises applying a palladium complex of a nitrogen containing ligand, preferably an aromatic nitrogen containing ligand, e.g., 2-aminopyridine, and thereafter reducing the adsorbed palladium species to become palladium nuclei with a borane reducing agent, such as sodium boranate (borohydride) or dimethylaminoborane. Furthermore the primer layer may be deposited using a direct deposition method such as an ink-jet technique or a microsyringe or micro-pen technique or a laser aerosol technique. Such direct deposition method may be used to apply an electrically conductive coating or a coating catalytic to electroless plating onto the dielectric surface, for example by spraying. The primer layer may be deposited by any of the methods mentioned herein before onto the produced structures only or onto the entire surface.

Thanks to the primer layer, the trenches and vias are preferably activated in three dimensions, meaning also on the walls of the trenches and vias.

In one embodiment of the invention, the primer layer applied onto the entire surface may be removed again, for example by laser ablation, from the sites that have not been structured before by laser ablation so that there is only the primer layer left in the trenches and vias. As the metal layer is then deposited, it is only formed in the desired areas.

Instead of performing the step of depositing a primer layer the trenches and vias may for example also be prepared i.e., activated for the subsequent metallization by irradiation, for example with UV-light, using suited dielectrics. For this purpose, substances that are rendered electrically conductive through laser irradiation may for example be deposited onto the bottom and the walls of the trenches and vias. Organic polymers such as bis-(ethyl thio acetylene) for example exhibit such properties.

Then, the metal layer is deposited onto the primer layer by electroless and/or electrolytic (wet-chemical) plating in such a manner that the trenches and vias are completely filled with metal. Pure metals or metal alloys may thereby be deposited. Copper or copper alloys are preferably deposited. In principle, other metals are also suited such as for example silver, palladium, nickel, cobalt, tin, lead, the alloys thereof and the alloys thereof with other elements such as with antimony, phosphorus and boron. The metal may be deposited electrochemically by using either direct current or pulsed current (unipolar, reverse pulse). For chemical (electroless) deposition, current copper baths are utilized, for example baths containing formaldehyde as a reducing agent and EDTA or tartrate as a complexing agent.

For the uniform electrochemical deposition of copper in the trenches and vias, baths are preferred that feature a small throwing power for filling the vias and the capacity of uniformly filling structures like in pattern plating. Using electroplating copper baths for forming the metal layer, current copper electrolytes are for example used, such as a sulfuric acid copper bath. In the sulfuric acid copper bath, the copper concentration is preferably set to lie at the solubility limit. Concentrations of 20 to up to 40 g/l of copper (preferably in the form of copper sulfate) may be utilized. They may further contain sulfuric acid in a concentration of up to 220 g/l as well as disulfide compounds, e.g., bis-(3-sulfopropyl)-disulfide disodium salt at a concentration of 0.3 to 2 ml/l. Levelers such as polyalkylene alkoxylates and the alkyl-/cycloalkyl derivatives thereof for example may be additionally used at a concentration of 13-18 ml/l.

For uniform metal-plating the carrier materials are treated by a vertical processing method and to particular benefit by a horizontal processing method with the electrolyte being supplied to the material at high speed and with microcirculation.

If the primer layer has been deposited onto the entire surface of the dielectric so that metal has not only formed in the trenches and vias as a result of wet chemical deposition, excess metal (copper) must be removed again from the surface of the dielectric according to method step f). Upon removal, a planarized surface with conductive (copper) being substantially flush with the dielectric surfaces is formed. The etching step is preferably performed at a temperature ranging from 25 to 45° C. A chemical etch solution is preferably used for etching. Alternatively, an electrochemical etching process using either direct current or pulsed current (unipolar, reverse pulse) may also be utilized. It is understood that electrochemical etching and chemical etching may also be combined, for example an electrochemical process for removing the major part of the excess metal and a chemical post etch step for etching away metal islands resulting from electrochemical etching. The surface may also be slightly brushed prior to etching in order to level the metal surface. Alternatively, a chemical-mechanical polishing process may be utilized, for example the process of S. Kondo et al. described in: J. Electrochem. Soc., 147, 2907 (2000), or the process described in U.S. Pat. No. 5,759,427 A, these documents being herein incorporated by reference.

Selective metallization of the structured dielectric may also be carried out using strippable or detachable cover layers, more specifically with the aid of electroplating resists. In this case, the primer layer applied to the resist surface and, at need, a first flash copper layer (chemical copper) are removed again by stripping the resist.

The metal layer and the primer layer as well may be removed by polishing and/or by a chemical back-etching technique and/or an electrochemical back-etching technique and/or by electropolishing and/or by pulse electrolysis.

For back etching, etch solutions on the basis of $FeCl_3$/HCl, $CuCl_2$/HCl or an ammoniacal etch can be utilized. Further, solutions with peroxomonosulfate and/or peroxodisulfate as well as $H_3PO_4$ can be utilized for chemical polishing and/or electropolishing. The horizontal technique is advantageously utilized for this purpose.

In a particular embodiment of the invention, functional layers may for example be deposited onto the metal layer for making electrical contact via contact fingers and for contacting semiconductor chips, for example gold or palladium layers. Functional layers for ball grid arrays and fine grid arrays are thereby technically advantageous.

The method of the invention can be used for both the horizontal and the vertical processing technique using industry standard equipment. In the horizontal technique, the carrier materials are horizontally conveyorized through a processing line. With the vertical technique, the material is vertically lowered into the processing tanks. The method of the invention is preferably used in horizontal lines. The advantage of this technique lies both in the easier handling of the very delicate carrier materials and in the possibility to only have excellent clean room conditions in the fully enclosed lines utilized for the horizontal technique. The cost of manufacturing the high integrated circuit carriers is thus considerably reduced.

A particularly suited first method variant for manufacturing multiple wiring planes with electrically conductive structures involves the following method steps:

i) A printed circuit board is provided with a dielectric.
ii) Recesses for circuit traces including vias are formed in the dielectric; the vias are made as deep as the metal base layer in order to establish a conductive connection with a wiring plane that is to be produced on the side of the metal base layer; optionally, the vias can be formed in the recesses; the metal base layer serves as a landing zone during laser ablation of the vias and in parts also for carrying the current during metal plating.
iii) The walls of the recesses including the vias are activated with a primer layer.
iv) Metal is deposited by electroplating onto the primer layer so as to completely fill the volume of the recesses including the vias.
e) Excess metal is removed.
v) Semiconductor chips can be embedded in the circuit carrier dielectric (chip-in-polymer technique); likewise, semiconductor chips may also be embedded into a secondary photoresist or in a permanent resist that is deposited onto the circuit carrier to form the terminating layer; in these cases, electric connections to circuit traces on the circuit carrier can be formed at contact pads on the chip; for this purpose, additional vias to the contact pads on the embedded chip can more specifically be formed in the embedding material for establishing the connections.

In this method variant for manufacturing multiple wiring planes with electrically conductive structures, the dielectric which is deposited onto the structured outer layer used as the base layer of a multilayer is provided to start with. The trenches and vias are formed in a first plane in the dielectric according to the afore mentioned method step ii). For the conductive interconnection of the wiring plane, vias extending as far as the outer layer of the multilayer are drilled in the dielectric.

In a further development of the afore mentioned embodiments, an additional layer of a dielectric, a secondary resist or a permanent resist is deposited onto the otherwise finished circuit carrier.

For better understanding of the invention, reference is made to the following Figures illustrating the various component types of the circuit carriers formed with sandwich construction:

FIG. 1 Component (circuit carrier) with a multilayer as the base layer and either one-sided or bidirectional design with one or two dielectric planes and with two wiring planes each;

FIG. 2 Schematic illustration of the method steps c) to g) during building of a multilayer;

FIG. 3 Schematic illustration during building of a multilayer according to FIG. 2 with combined method steps d) and e);

FIG. 4 Schematic illustration during building of a multilayer according to FIG. 2 using a printed circuit board as the base layer 9;

FIG. 5 Illustration of a filled via (left) and of a circuit trace (right) after metallization in an electron microscopic cross-sectional view;

FIG. 6 Electron microscopic view of two or three circuit traces after metallization;

FIG. 7 Representation of a top view of an electroplated dielectric with protruding copper after metallization;

FIG. 8 Representation of a top view of the electroplated dielectric with protruding copper and intersecting circuit traces after metallization;

FIG. 9 Illustration of an electroplated, structured dielectric after the excess copper has been etched away;

FIG. 10 SEM (=Scanning Electron Microscopy) photograph of a circuit carrier with recessed trenches and vias generated by laser ablation with a laser in-focus;

FIG. 11 Detail of FIG. 11;

FIG. 12 SEM photograph of a 15 µm wide recessed trench with a trench profile after single pass laser scanning;

FIG. 13 SEM photograph of a 60 µm wide recessed trench with a trench profile after multiple pass laser scanning;

FIG. 14 Photograph of a circuit carrier with copper-filled trenches and vias;

FIG. 15 Photograph of a circuit carrier with unfilled trenches and vias the photograph displaying lateral dimensions;

FIG. 16 Cross-sectional photograph of trenches and vias;

FIG. 17 Cross-sectional photograph of a via with an upper trench connected thereto and the via being connected to a copper base underneath;

FIG. 18 Schematic Illustration of a substrate design with vias and traces in a front view and in a cross-sectional view.

To manufacture the component of FIG. 1, a multilayer core comprising conductor patterns on either side where appropriate is taken as the starting material. In this case, dielectric layers are applied either on both sides or on only one side to the outer sides of the multilayer and the dielectric layers are structured in accordance with the invention. In the lower exemplary embodiment of FIG. 1, a second dielectric layer has been deposited onto the top side of the multilayer after the first dielectric layer had been structured and the circuit traces and filled vias formed.

FIG. 2 schematically shows the design of a conductor structure plane during building of a multilayer, with the method steps c) to g) of the method of the invention for treating the carrier material consisting of the dielectric 6 and the (schematically shown) base layer 9 being represented. In c), the dielectric 6 was structured by laser ablation by which trenches 2 and vias 1 and trenches with via 3 were formed, with the vias 1 and the trenches with via 3 extending as far as the base layer 9. In d), the trenches 2, the vias 1 and the trenches with via 3 were coated with a primer layer 4 and then electroplated in e), being thereby completely filled with metal 5. A metal layer 5 also formed on the surface of the dielectric 6. An electroless copper layer was first deposited to form a first electrically conductive metal layer. After that, metal could also be deposited by electroplating. After the excess metal 5 was removed with a back-etching process in f), another layer of dielectric 6' was deposited in g) to build up a multilayer using the method of the invention.

In this embodiment of the invention, the base layer 9 served as a landing zone or as a base of the laser bore holes since the laser was not capable of removing metal on the base layer 9.

FIG. 3 schematically shows the design of a conductor structure plane during building of a multilayer corresponding to FIG. 2 with the method steps d) and e) being combined into one step, which further increases the efficiency of the method.

FIG. 4 schematically shows the design of a conductor structure plane during building of a multilayer with the illustration corresponding in principle to FIG. 2. A printed circuit board 9 with a structured outer copper layer 10 was used as the base layer. In a previous step, the dielectric 6 was deposited onto the structured outer copper layer 10. As described with respect to FIG. 2, this step was followed by structuring the dielectric, depositing the primer layer and activating and metal plating according to the steps c)-e) respectively. Next, the excess metal 5 was removed in f) and a further dielectric 6' was deposited in g) as described with respect to FIG. 2.

In this embodiment of the invention, part of the embedded vias and trenches with via are configured in such a manner that they extend downward as far as the structured outer copper layer, making contact with parts of the structured copper outer layer 10.

Two exemplary embodiments for manufacturing circuit carriers will be described in detail herein after.

The carrier material used is a foil (Isofoil 160i) made from a 18 µm thick copper layer on a 65 µm thick dielectric (FR4 resin B stage). At first, identical pieces of the carrier material were pre-treated by means of a curing cycle:

Heating 40 min @ 25-180° C.
Curing 90 min @ 180° C.
Cooling 90 min @ 180-25° C.

and then the method of the invention was carried out according to the steps a) to f).

An LPKF excimer laser with a wavelength of 308 nm was used in a cross-pattern mode of operation for structuring the dielectric with projection technique, metal masks with a line design being utilized therefore. After the first laser ablation the mask was rotated 90° and the second projection direction was laser irradiated. The points of intersection were irradiated with twice as much energy with the resulting vias being formed to extend as deep as the copper layer.

The following steps were performed with the same starting material which was prepared like described herein above, with the dielectric in Example 1 being structured by means of a laser unlike Example 2.

a) Providing the carrier material for the Examples 1 and 2
b) Laser ablation in Example 1:
   Mask with spaces/lines dimensions of 35 µm/40 µm.
   250 pulses of 650 mJ in each projection direction.
b) Laser ablation in Example 2:
   Mask with spaces/lines dimensions of 110 µm/250 µm.
   150 pulses of 650 mJ in the first projection direction;
   350 pulses of 650 mJ in the second projection direction.
c) Depositing the primer layer in the Examples 1 and 2:
DS-PTH method sequence, vertical:

| | |
|---|---|
| Swelling agent Securiganth ® (Atotech) | 2 min @ 77° C. |
| Permanganate etch (Atotech) | 8 min @ 70° C., ultrasound |
| Reducer conditioner (Atotech) | 5 min @ 48° C. |
| Cleaner Securiganth ® | 5 min @ 57° C. |
| Etch cleaner Securiganth ® | 2 min @ 25° C. |
| Pre-dip Neoganth ® (Atotech) | 1 min @ 25° C. |
| Activator Neoganth ® | 5 min @ 39° C. |
| Reducing agent Neoganth ® | 5 min @ 30° C. |
| Electroless copper Printoganth ® (Atotech) | 30 min @ 32° C. | d) Depositing the metal layer in the Examples 1 and 2 Metallization conditions in the vertical technique:

| | |
|---|---|
| Cleaner Cupra Pro (Atotech) | 5 min @ 39° C. |
| Etch cleaner Securiganth ® | 30 sec @ 28° C. |
| Descaling (10 wt. % $H_2SO_4$) | 2 min @ 25° C. |

Electroplating with
Cupracid® (Atotech) at a current density of 1 $A/dm^2$ @ 27° C.
e) Removing the metal layer in the Examples 1 and 2:

The excess metal was completely etched away in two method steps with the conductor structures remaining intact.

In the first step a horizontal line was used:
Pill etcher
Iron chloride/hydrochloric acid, 35° C.
1.2 m/min, 4.6 µm removal In the second step a vertical line was used:
Vertical module
Potassium hydrogen peroxomonosulfate, 28° C.
1.7 µm/min removal FIG. 5 is an electron microscopic cross-sectional view of a filled via (to the left) and of a circuit trace (to the right) with a metal layer extending over them and there beyond after metallization, 0.3 ml/l brightener (Atotech) and 13 ml/l basic leveler (Atotech) having been added to the metal plating bath during metal plating with a sulfuric acid copper bath. The via is embedded as deep as the plane of the carrier element and is filled with metal.

The left-hand photograph in FIG. 6 shows two circuit traces and the right-hand photograph three circuit traces with a metal layer extending there beyond in an electron microscopic cross-sectional view after metallization, 0.8 ml/l brightener (Atotech) and 14 ml/l basic leveler (Atotech) having been added to the metal plating bath during metal plating with a sulfuric acid copper bath.

EXAMPLE 3

Further example work was performed by using a 150 µm thick plated via and circuitized printed circuit board consisting of a common epoxy resin based FR4 substrate which was manufactured by means of conventional methods, such as mechanical drilling, desmear, activation, electroless plating and electrolytic panel plating. Conventional dry film resist imaging and acid etching were employed to create the circuit pattern.

An RCC foil (resin coated 18 µm thick copper foil) with 70 µm resin, Isofoil (Isola), was then laminated to both sides of the core board by means of heat and pressure using standard industry conditions for FR4. The obtained substrate was then etched in an acid etchant to remove the unwanted copper clad foil from the RCC epoxy resin layer.

The resultant bare epoxy layer (dielectric) acts as the base for formation of a signal layer with recessed circuit traces and blind micro vias, created simultaneously, by means of laser ablation of the dielectric.

Laser ablation of circuit trenches and blind micro via holes was simultaneously performed using a UV laser with 355 nm wavelength with a beam spot size of 15 µm, operating at an average power range of 4 W-8 W @ 20 kHz. This operation resulted in 15 µm ablation depth at an ablation speed of 300 mm/sec.

It turned out that scanning speed considerably depends on the material type and on the feature size.

In a further experiment oxygen was flown over the dielectric surface while the laser beam was scanned across the surface. Scanning speed was enhanced considerably.

Figure 1:
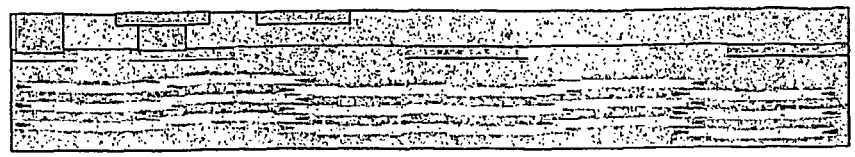
Figure 1:
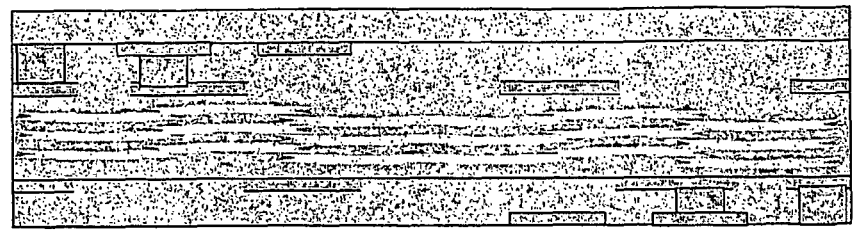
Figure 2:
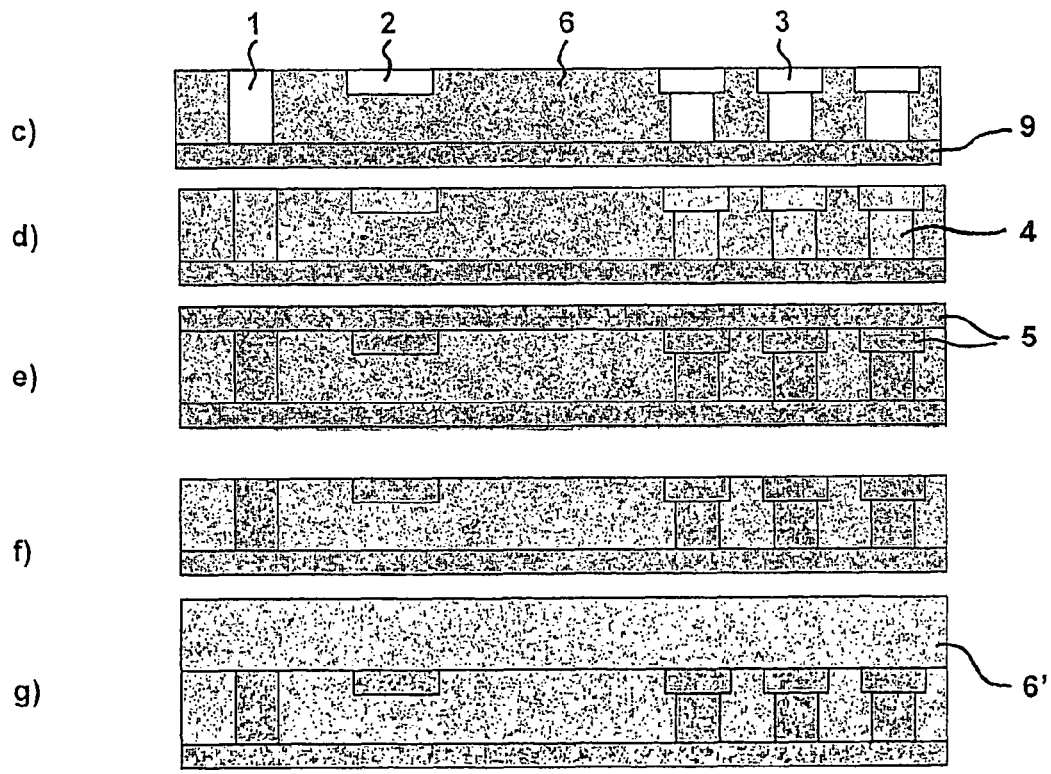
Figure 3:
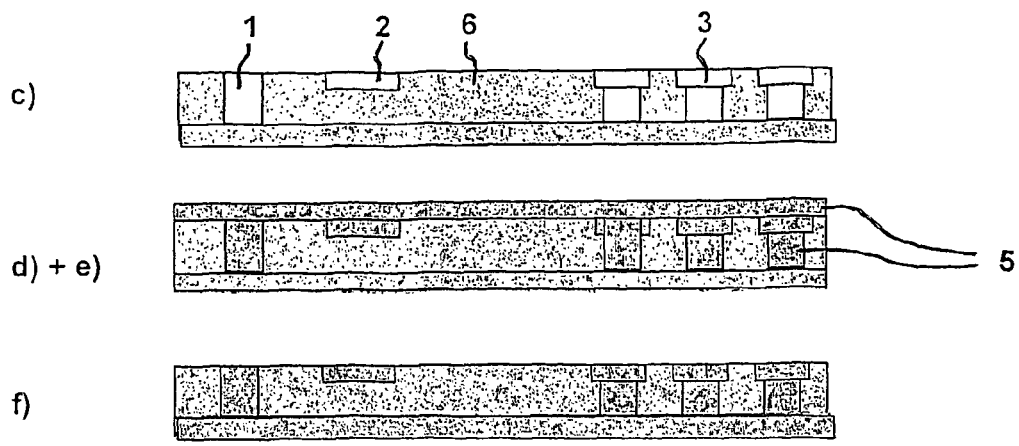
Figure 4:
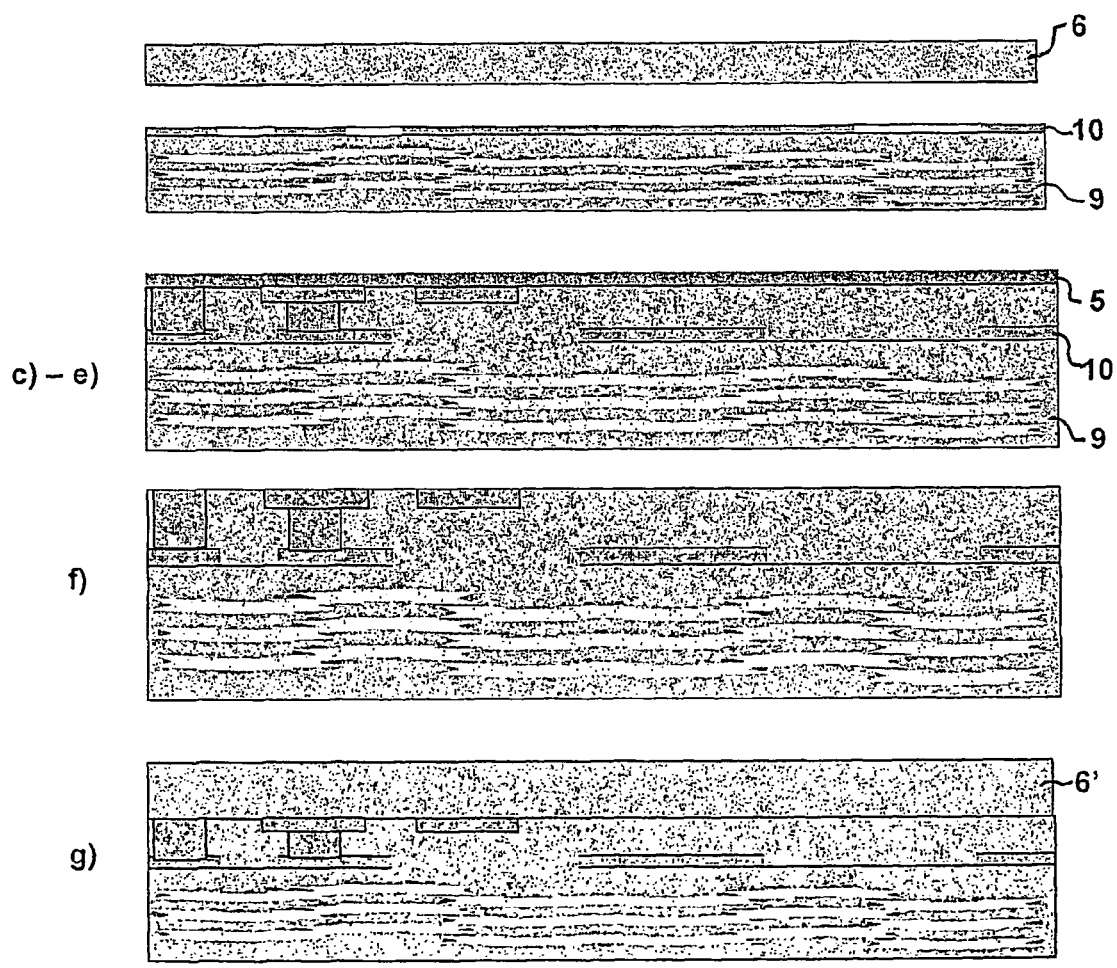
Figure 5:
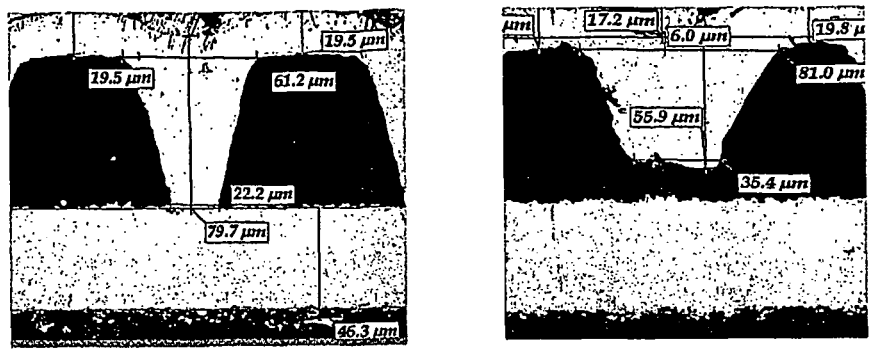
Figure 6:
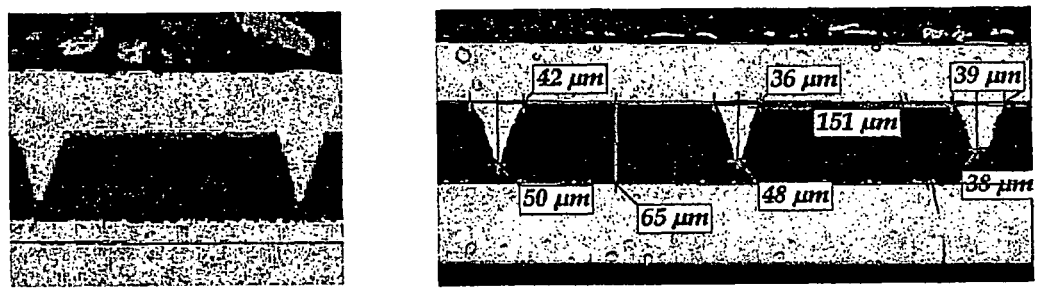
Figure 7:
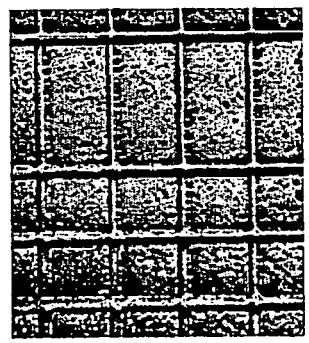
FIG. 7 is a top view of an electroplated dielectric with copper protruding from the filled trenches and vias after copper plating, 0.8 ml/l brightener (Atotech) and 14 ml/l basic leveler (Atotech) having been added to the metal plating bath during metal plating.
Figure 8:
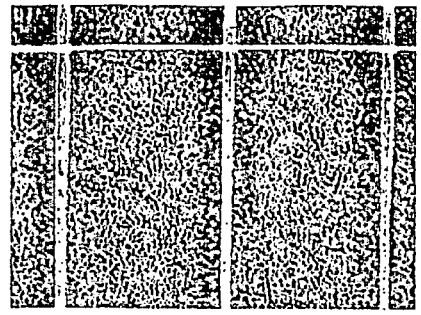
FIG. 8 is a top view of the electroplated dielectric to a larger scale than FIG. 7 with copper protruding from the circuit traces and from the points of intersection of said traces, 0.9 ml/l brightener (Atotech) and 16 ml/l basic leveler (Atotech) having been added to the metal plating bath during copper plating.
Figure 9:
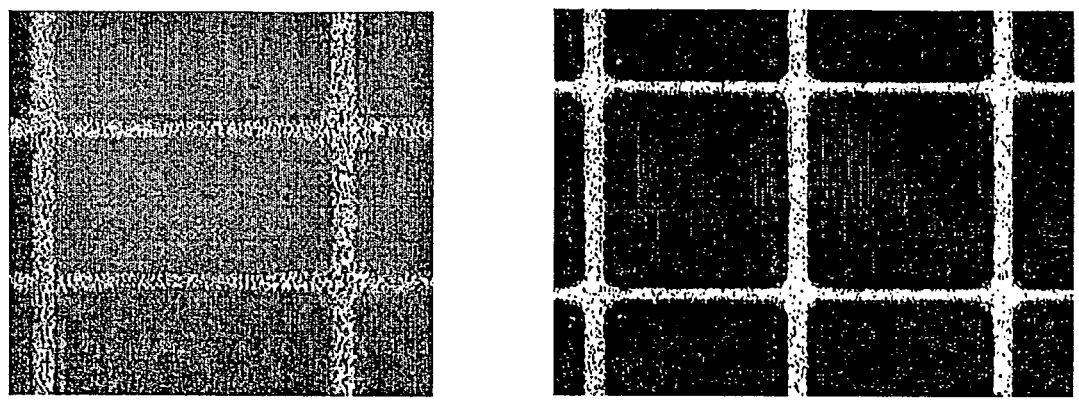
FIG. 9 is a top view of a structured electroplated dielectric after excess copper was etched away twice. The excess was completely removed with the conductor structures remaining intact.
Figure 10:
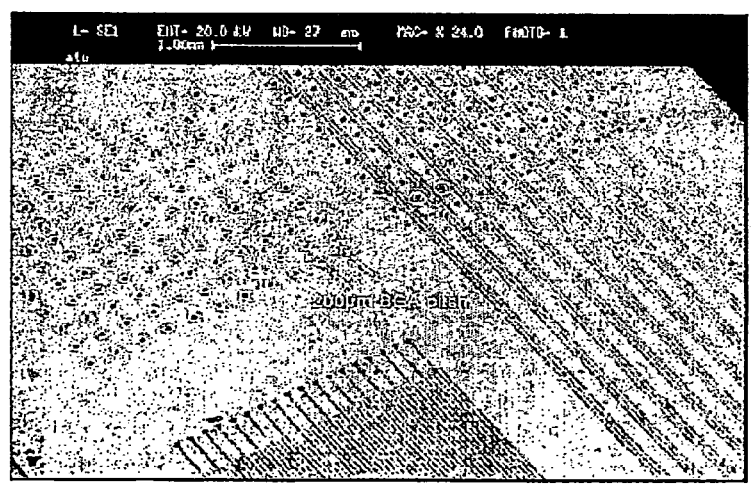
Figure 11:
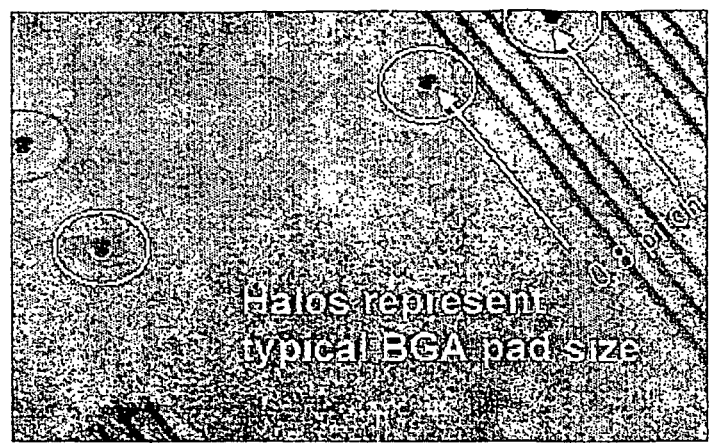

The recesses formed by laser ablation are shown in an SEM photograph. FIG. 10 displays this photograph with recessed traces (trenches) and holes (vias). A magnified photograph of this circuitry is shown in FIG. 11, displaying again the trenches and vias. Schematically the halos of typical BGA pads are marked into this photograph in order to demonstrate the space required if conventional methods were used to produce traces and through holes. From this FIG. it is apparent that three traces may pass through between two vias conveniently. If the large BGA pads would have to be created on the board surface (in order to compensate for misregistration with conventional techniques, because in this case the traces would have to meet the holes for generating electric contact to the through holes, even if misregistration takes place), only one trace could pass between two pads, but not three.

The panel was then treated with the Atotech PTH sequence listed in the following Table 2 to render raised surface portions and recessed structures conductive (i.e., the entire surface of the panel) for subsequent electrolytic copper plating.

Figure 12:
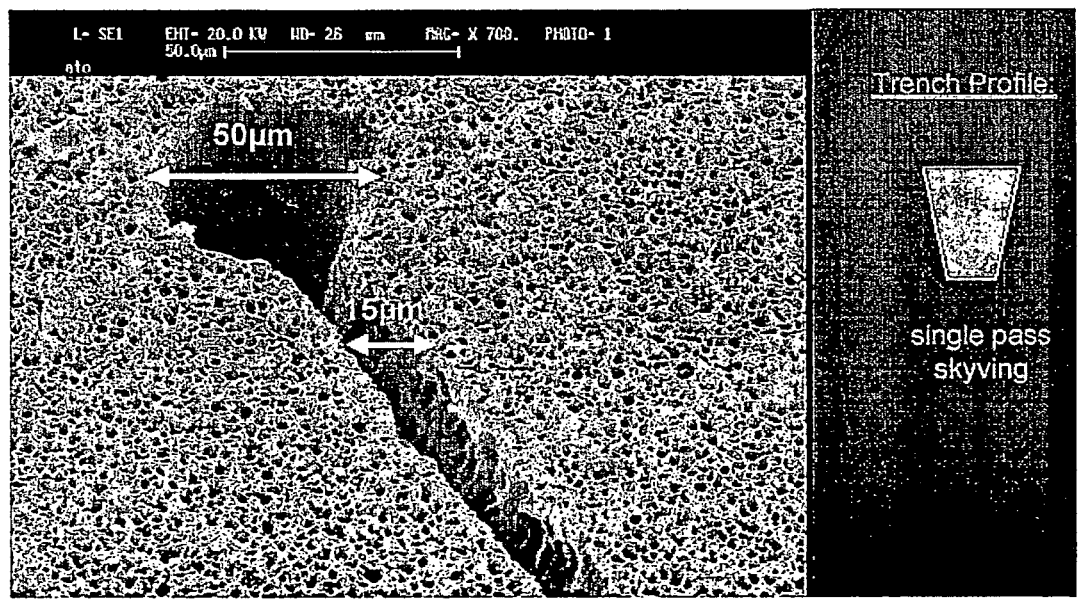
Figure 13:
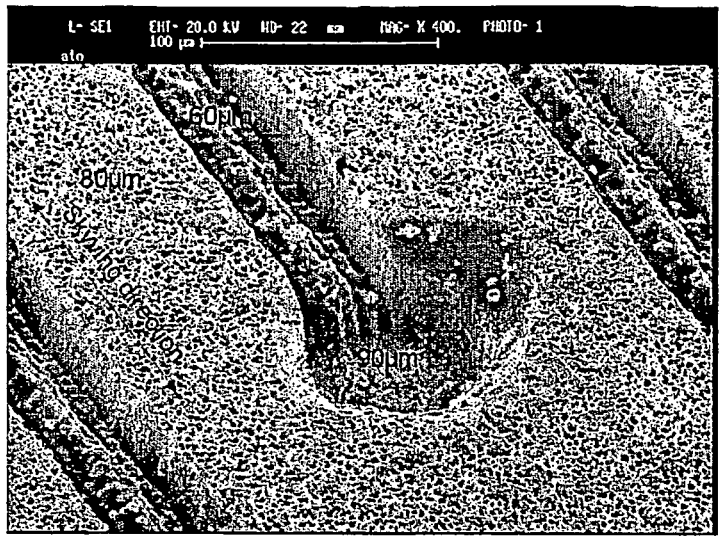
Figure 13:
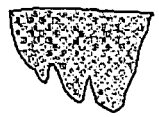
Figure 13:
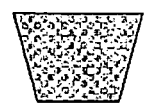

A strongly magnified photograph of a trench is shown in FIG. 12 with one laser scan along the line path to create a narrow trench. In FIG. 13 an SEM detail of a hole-trench intersection created with multiple laser scans along the line path to create a wider trench is shown. The image has been taken prior to laser polishing showing 0.8 mm BGA. Several different laser routines are possible.

TABLE 2

| | Process sequence: | | |
|---|---|---|---|
| Bath | Make up | Time | Temp. |
| Sweller Securiganth ® P | 400 ml/l Sweller Securiganth ® P, conc. 10 g/l NaOH | 2 min | 65° C. |
| Permanganate-Etch Solution Securiganth ® P-500 | 110 ml/l Dosing Solution Securiganth ®, P500 105 ml/l pH Correction Solution CC | 4 min | 75° C. |

TABLE 2-continued

| Bath | Make up | Time | Temp. |
|---|---|---|---|
| Process sequence: | | | |
| Reduction Conditioner Securiganth ® P 500 | 100 ml/l Reduction Cond. Sec. P 500, conc. 40 ml/l $H_2SO_4$, conc. | 5 min | 50° C. |
| Cleaner Securiganth ® Flex | 40 ml/l Cleaner Sec. Flex 20 g/l NaOH | 4 min | 50° C. |
| Etch Cleaner NaPS/$H_2SO_4$ | 150 g/l NaPS *) 35 ml/l Sulfuric acid, 50% w/w | 1 min | RT **) |
| Pre Dip Solution Neoganth ® B | 10 ml/l Pre Dip-Sol. Neoganth ® B, conc. | 1 min | RT **) |
| Activator Neoganth ® 834 | 40 ml/l Activator Neoganth ® 834, conc. 5.5 ml/l pH-Correction Solution CC pH 11.5 | 5 min | 40° C. |
| Reducer Neoganth ® WA | 5 g/l Boric acid 6 ml/l Reducer Neoganth ® WA, conc. | 4 min | 30° C. |
| Printoganth ® PV | 85 m/l Printoganth ® V Basic Solution 45 ml/l Printoganth ® V Copper Solution 8 ml/l Printoganth ® PV Starter 1.5 ml/l Printoganth ® PV Stabilizer | 20 min | 34° C. |

*) NaPS: sodium peroxodisulfate
**) RT: room temperature

In the next step the panel was electrolytically copper plated on the entire surface thereof including the recesses. Plating was performed at 1.3 A/dm$^2$ with a plating bath containing 40-45 g $Cu^{2+}$/l, 140 g-160 g $H_2SO_4$/l, 30-40 ppm chloride, 4-6 g/l Fe(II), 0.5-1.5 g/l Fe(III).

A copper layer of approx. 20 μm thickness was plated within 85 min.

In the next step, the bulk of the copper layer was removed from the raised portions of the panel were no conductor structures were desired, by means of chemical etching. The etching was carried out with cupric chloride solution in a standard etching line, Sigma HDC from Chemcut Corp./US. Grinding, polishing or milling then removed the remaining 2 μm-3 μm of copper. (See detailed process description herein below).

Figure 14:
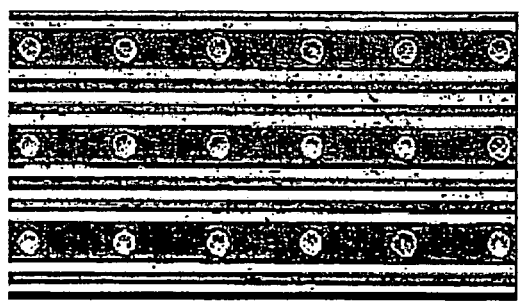
Figure 15:
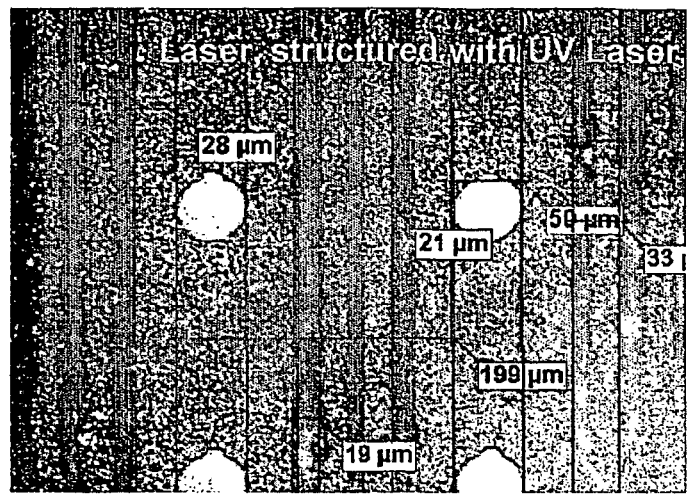
Figure 16:
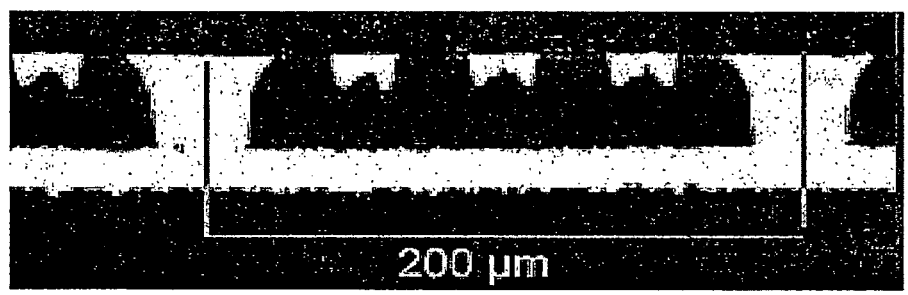
Figure 17:
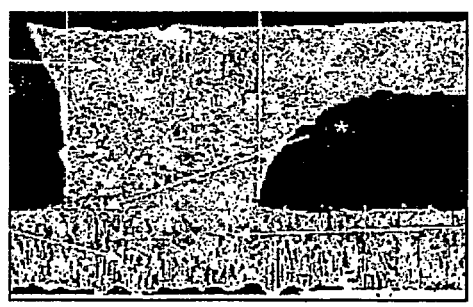

FIG. 14 shows the copper-filled vias and copper traces in the trenches (three lines between 0.2 mm pitch BGA). The photograph of FIG. 15 shows the dimensions of the traces and vias of the specimen shown in FIG. 14 prior to metallization: The vias have a diameter of about 50 μm, the traces have a line width of about 20 μm. FIG. 16 shows a cross-section of such vias and traces with the vias connecting to a copper plane underneath. An excellent copper bonding is created between the copper metal in the vias and the copper metal in the traces. This is shown in FIG. 17: A smooth transition without any sharp corner is created between the copper metal in the via and the copper trace extending to the right. This ensures good stability of the copper to withstand thermal load.

EXAMPLE 4

A bare pure polyimide foil (SPB 050 Espanex—Nippon Steel) was laminated on both sides of a 150 μm thick FR4 multilayer substrate core, following the standard conditions recommended by the supplier.

Laser ablation of circuit trenches and blind micro via holes was again simultaneously performed using similar conditions as with the sample of Example 3 . A UV laser with 355 nm wavelength with beam spot size of 15 μm was used, operating at an average power range of 4 W-8 W @ 20 kHz, resulting in 15 μm ablation depth at an ablation speed of 300 mm/sec.

The panel was treated with PTH conditions similar to the sample of Example 3 to render raised and recessed structures in the polyimide foil conductive.

The sample was then plated using the identical conditions as with the sample of Example 3.

In the next step, the bulk of the copper layer was removed from the raised portions of the panel, where no conductor structures were desired, by means of chemical etching. The etching was carried out with cupric chloride solution in a standard etching line, Sigma HDC from Chemcut Corp./US. Grinding, polishing or milling then removed the remaining 2 μm-3 μm of copper. (See detailed process description below).

EXAMPLE 5

A similar substrate build up was used as with the sample of Example 4.

Ablation of recessed structures in the polyimide foil was carried out with an excimer laser at 300 Hz and 308 nm wavelength by means of mask projection. Ablating circuit lines and micro via openings required two separate masks. About 50 pulses at an ablation rate of 0.3 μm/pulse were required to ablate 15 μm deep circuit patterns incl. annular micro via pads on one side of a square sized circuit with 6 sq/inches.

An additional 105 pulses were needed to ablate the via holes at the remaining polyimide thickness of 35 μm.

In the next step, the bulk of the copper layer was removed from the raised portions of the panel, where no conductor structures were desired, by means of chemical etching. The etching was carried out with cupric chloride solution in a standard etching line, Sigma HDC from Chemcut Corp./US. Grinding, polishing or milling then removed the remaining 2 μm-3 μm of copper. (See detailed process description below).

Selection Process (to generate discrete circuitry and vias):
Step 1:

Using industry standard etching technology (equipment and chemistry) set at standard industry parameters, but with a contact time set to remove the bulk (85%) of the over-plated copper created during the filling process.

Industry standard processes including:
  Alkaline etching;
  Acidic—Cupric, Ferric Chloride etching;
  Sulfuric/Peroxide etching;
or specifically developed systems such as:
  Electrolytic etching using DC or pulse/reverse pulse technology.

Step 2:
Removal of the remaining 15% of over-plated copper (and activation layer) using one of the following industry standard methods:
  Mechanical planarization using rigid milling tools;
  Differential etch using industry standard micro etch parameters (peroxides, persulfates, oxone/caroate, etc.);
  Chemical mechanical planarization (rotary, linear, etc.);
  Mechanical soft brushing (with or without pumice).

Figure 18:
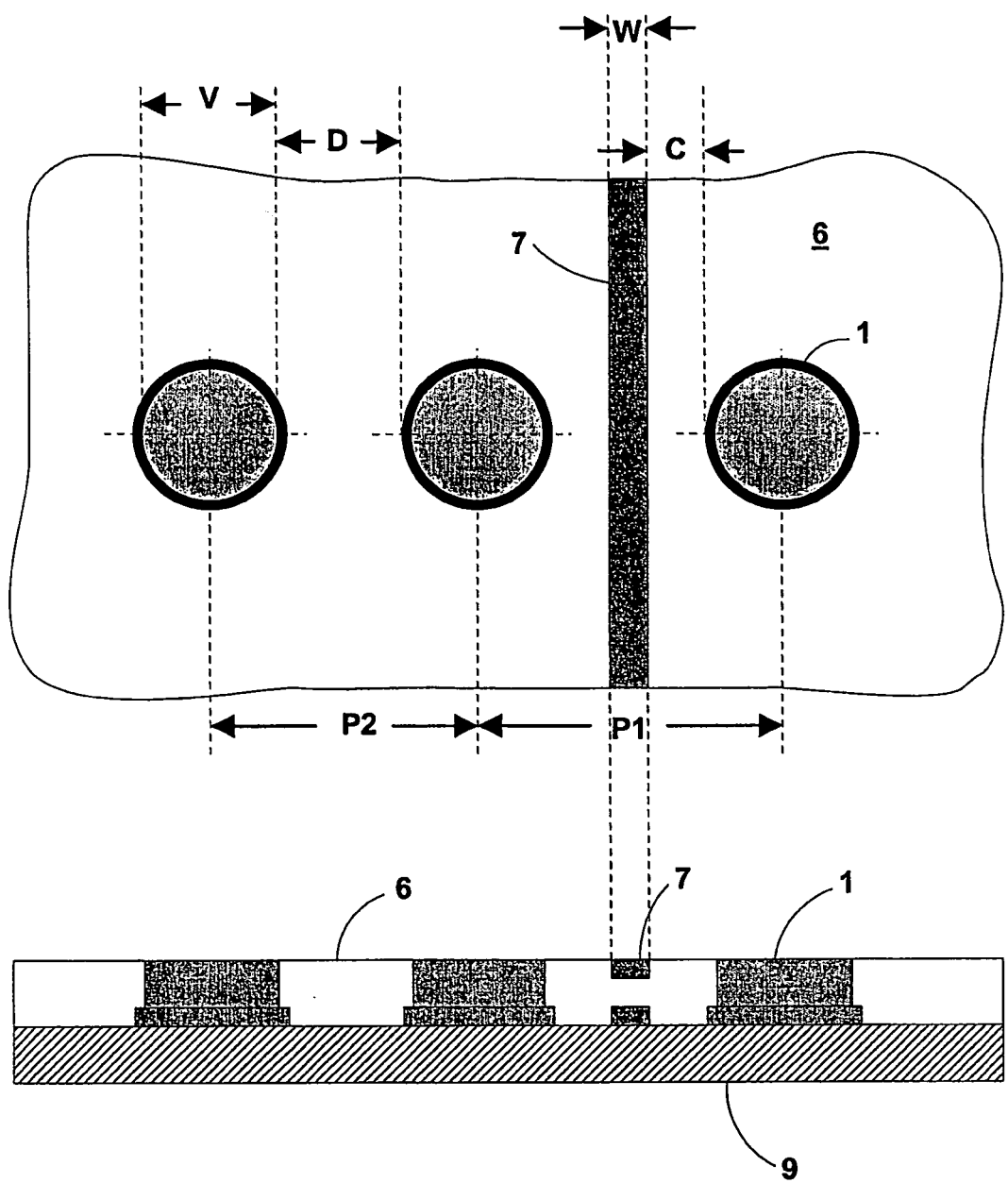

The above Examples show that it will thus be possible to produce circuit carriers which are based on a cost-effective printed circuit board, having extremely fine structures with dimensions as low as outlined in Table 3 with reference to FIG. 18:

TABLE 3

Carrier Design

| Parameter Dimensions | [μm] |
| --- | --- |
| Via Diameter V | 60 |
| Minimum Line Width W | 15 |
| Minimum Width between Pads D | 15 |
| Minimum Clearance between Pad and Traces C | 15 |
| Pitch (one trace pass) P1 | 130 |
| Pitch (no trace pass) P2 | 115 |

FIG. 18 illustrates a carrier design schematically. This carrier is provided with three vias 1 which are filled with copper. Two of these vias are adjacent with no trace being conducted between them. Another two vias are adjacent with one trace 7 being conducted between them. The parameter dimensions given in Table 3 are values achieved if the present invention is realized. According to the present invention this design is attained with simultaneously realizing the design for a competitively-priced circuit carrier by using conventional printed circuit boards as a base for HDI circuit being formed thereupon.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

Numerals:
1 via, copper filled via
2 trench
3 trench with via
4 primer layer
5 metal (copper)
6,6' dielectric
7 copper trace
9 printed circuit board
10 structured outer copper layer

The invention claimed is:

1. A method of manufacturing a high density circuit carrier, said method comprising the following method steps:
   a) Providing a printed circuit board having circuit traces on at least one side thereof;
   b) Coating the printed circuit board on the at least one side thereof with a dielectric to form a dielectric layer over the circuit traces;
   c) Structuring the dielectric layer for producing trenches and vias therein using laser ablation, the trenches not extending completely through the dielectric layer to the circuit traces and the vias extending through the dielectric layer to the circuit traces;
   d) Depositing a primer layer onto the entire surface of the dielectric layer or depositing the primer layer into the produced trenches and vias only;
   e) Depositing a metal layer onto the primer layer, with the trenches and vias being completely filled with metal for forming conductor structures therein; and
   f) Removing the metal layer and the primer layer, except for in the trenches and vias, to expose the dielectric layer if the primer layer has been deposited onto the entire surface in method step d).

2. The method according to claim 1, characterized in that the trenches and vias are produced in one single process operation in method step c).

3. The method according to claim 1, characterized in that the trenches and vias are produced using a direct-write technique in method step c).

4. The method according to claim 3, characterized in that the direct-write technique comprises scanning a laser beam across the dielectric layer at those surface regions of the dielectric layer in which the trenches and vias are to be produced.

5. The method according to claim 4, characterized in that the direct-write technique further comprises adjusting the power of the laser beam to depend on the depth of the trenches and vias to be produced.

6. The method according to claim 3, characterized in that the direct-write technique further comprises adjusting the power of the laser beam to depend on the depth of the trenches and vias to be produced.

7. The method according to claim 3, characterized in that the direct-write technique further comprises pulsing the laser beam.

8. The method according to claim 7, characterized in that the direct-write technique further comprises adjusting the energy amount of the laser beam irradiated to a surface area of the dielectric layer to depend on the depth of the trenches and vias to be produced by setting the number of laser pulses being irradiated to said surface area.

9. The method according to claim 8, characterized in that the direct-write technique further comprises decreasing the energy amount of successive energy pulses being irradiated to a surface area of the dielectric.

10. The method according to claim 7, characterized in that the direct-write technique further comprises decreasing the energy amount of successive energy pulses being irradiated to a surface area of the dielectric layer.

11. The method according to claim 1, characterized in that the trenches and vias are connected to each other in a landless design.

12. The method according to claim 1, characterized in that the following further method steps are performed once or several times after method step f): g) Depositing another dielectric layer onto the dielectric layer being provided with trenches and vias; and h) Repeating the steps c) through f).

13. The method according to claim 12, characterized in that a terminating layer is deposited after any one of method steps f) or h).

14. The method according to claim 1, characterized in that the primer layer is deposited by performing a treatment with metal activators or with monomer solutions for forming conductive polymer layers or with carbon suspensions or by sputtering or performing by a direct deposition method.

15. The method according to claim 1, characterized in that the metal layer is formed by electroless and/or by electrolytic plating.

16. The method according to claim 1, characterized in that the metal layer and the primer layer are removed by polishing and/or by a chemical back-etching technique and/or an electrochemical back-etching technique and/or by electropolishing.

17. The method according to claim 1, characterized in that producing trenches and vias in the dielectric layer in method step c) comprises producing trenches, said trenches also comprising vias.

18. The method according to claim 1, characterized in that functional layers are deposited onto the metal layer for electrically contacting electric components.

19. The method of claim 1 wherein the circuit carrier is manufactured in a horizontal line.

20. The method according to claim 1, characterized in that a terminating layer is deposited after method step f).

21. The method according to claim 1, characterized in that the trenches and vias are produced using a direct-write technique in one single process operation in method step c).

22. The method according to claim 1, characterized in that the printed circuit board is a multilayer circuit board comprising two sides and a conductor pattern on each side.

23. The method according to claim 1 characterized in that the trenches and vias have a V-shape cross-section.

24. The method according to claim 1 characterized in that in method step c) the laser ablation comprises contacting the dielectric layer with a reactive gas during the laser ablation.

\* \* \* \* \*